United States Patent [19]

Oliver

[11] Patent Number: 4,727,317

[45] Date of Patent: Feb. 23, 1988

[54] DEVICE ORIENTATION TEST METHOD SUITABLE FOR AUTOMATIC TEST EQUIPMENT

[75] Inventor: Martin J. Oliver, Poole, England

[73] Assignee: Membrain Ltd., Dorset, England

[21] Appl. No.: 796,351

[22] Filed: Nov. 7, 1985

[30] Foreign Application Priority Data

Nov. 9, 1984 [GB] United Kingdom ............... 8428405

[51] Int. Cl.[4] .................................................. G01R 31/00
[52] U.S. Cl. ............................. 324/158 R; 324/73 R; 371/20
[58] Field of Search ............. 324/158 R, 73 R, 133, 324/158 D, 158 T; 371/20, 25; 340/653, 635

[56] References Cited

U.S. PATENT DOCUMENTS

| | | | |
|---|---|---|---|
| 3,356,945 | 12/1967 | Ryan et al. | 324/158 T |
| 3,458,814 | 7/1969 | Ryan | 324/158 T |
| 3,601,698 | 8/1971 | Thurman, Jr. | 324/158 T |

FOREIGN PATENT DOCUMENTS

| | | |
|---|---|---|
| 1245781 | 9/1971 | United Kingdom . |
| 1255441 | 12/1971 | United Kingdom . |
| 1376595 | 12/1974 | United Kingdom . |
| 2019012 | 10/1979 | United Kingdom . |
| 1322182 | 7/1983 | United Kingdom . |

OTHER PUBLICATIONS

Jim Healy; "In-Circuit Testing Today"; 1979 New Electronics; pp. 24–29.
"Wiregen Program"; Fair Child 1983; pp. 6.2–6.10.
Tashioglau; "Current Aspects of LSI Board Level Testing"; Electronic Engineering; Apr. 1979.

Primary Examiner—Reinhard J. Eisenzopf
Assistant Examiner—Vinh P. Nguyen
Attorney, Agent, or Firm—Ladas & Parry

[57] ABSTRACT

Part of a printed circuit board circuit is made up of three gates (30, 31, 32) each of which are formed on a different device and interconnected by the board print so that connections (35, 36) may be established by means of probes. Associated with the inputs and outputs of each device are phantom diodes (such as diode 32) which are normally connected to circuit ground (38) but which in the case of one gate (31) are connected the supply rail (37), the device of which it forms part having been mounted in the board in the wrong orientation. By the steps of connecting one device power input pin to a test ground potential (38), raising the potential of the other power input pin via connection to a supply rail (37) and lowering the potential of an active pin (33) a diode (302) may be made to conduct current via path (304) indicating that the device (31) is wrongly orientated. The applied low potential is insufficient to bring correctly connected diodes (such as that of device 30) into conduction.

17 Claims, 5 Drawing Figures

DEVICE ORIENTATION TEST METHOD SUITABLE FOR AUTOMATIC TEST EQUIPMENT

This invention relates to a method of device orientation testing and in particular to a method suitable for Automatic Test Equipment (ATE).

Interconnected devices are often assembled into functional circuits by means of a circuit board. Many circuit boards carry integrated circuits either exclusively or together with discrete components. To test an assembled board it is possible to perform a functional test, that is to apply power to the board, apply known input signals to board input ports and examine signals at board output ports to see if they are as expected. It will be appreciated that whilst enabling faulty boards to be rejected, it is difficult to analyse test results to diagnose the board fault so that the board may be repaired. Thus in many applications, particularly automated or semi-automated production lines, a component level test is preferred, possibly followed by a functional test once the components are proved.

A printed circuit board (pcb) carries tracks which establish the interconnection pattern between devices required for the circuit to function. Thus from any particular device connection there will be paths to other device connections. Such an interconnection is referred to in the art as a network. Typically, a printed circuit board comprises a plurality of networks. In device testing, contact is made with some or all networks on the board by means of a bed of nails fixture. Such a fixture, which essentially comprises elongated pins (the nails) forced into contact with the pcb tracks, is well known in the art and will not be further described here. By applying signals to some nails and making measurements at others, device testing may be performed. It is sometimes necessary to apply guard signals to nails to prevent disruptive interactions, but all of this is known in the art, and many such automatic test equipments are in successful operation; it being economically viable on many production lines to change faulty devices and reclaim an otherwise faulty board.

A particularly troublesome board fault is when integrated devices are inserted to the board in the wrong orientation, as is easily possible by virtue of the symmetry of many of the favoured integrated circuit packages, such as the common dual-in-line (DIL) package having equal and parallel rows of equally spaced connection pins. Frequently with a mis-oriented device, device inputs will be placed at expected outputs and outputs at expected inputs. Such a device will naturally fail a device test. The device will also disrupt the performance of other devices which have a connection to networks associated with a device, thus typically ATE will fail a cluster of devices connected to such networks in addition to the device itself. The result is that several good devices are unnecessarily changed when all that was infact required was re-orientation of a single device.

Although wasteful, it might appear that prior art ATE has at least enabled a faulty board to be reclaimed. Unfortunately, mis-orientation of a device and cross connection of inputs and outputs means that it is very likely that low impedances will appear at circuit nodes where a high impedance is expected. When devices are powered so that a device test may be performed outputs will be driving low impedances and the device subjected to conditions outside its electrical tolerance. Hence a repaired board which passes all device and functional tests may remain latently faulty, amd thus have degraded reliability.

It is clearly a serious drawback of ATE that it can introduce faults to a board that were not present before testing.

An integrated circuit typically comprises power input pins and a plurality of active pins, which constitute device inputs and outputs. The device is formed on a substrate of semi-conductor material, which substrate is normally connected to a device power input pin.

Typical semi-conductor processes result in the presence of diodes between active pins and power input pins, which in normal operation are reverse biassed, taking no part in device operation. When a device is mis-orientated it is often conduction through a foward biassed diode of this type that is electrically damaging to devices connected thereto.

It is an object of the present invention to exploit device characteristics, such as internal diodes or capacities, by performing measurements at device pin connections, that is the positions at which device pins would appear if correctly orientated.

According to the present invention a method of testing device orientation includes the steps of:
locating a device power input pin connection,
locating a device active pin connection,
applying a voltage of magnitude less than device operating voltage to said device power input pin connection,
applying a voltage of opposite polarity to said device active pin connection,
measuring an inter pin electrical characteristic of the device in the presence of the applied voltages,
and performing a measurement analysis for a characteristic consistent with a mis-orientated device.

Preferably pin connection location is achieved by knowlege of device or board layout stored in ATE memory. Where the device pin connection layout is such that mis-orientation results in exchange of first and second power input pins, the power input pin connections may be made via board supply rails where interconnected devices are so mounted. The measurements may be established as consistent or in-consistent with diode conduction by comparison with a threshold level determined in accordance with previous measurements made on devices of the same type, or alternatively by stored comparison with a measurement obtained with a known to be good board.

Advantageously, measurements may be made at different applied voltages to establish consistency with forward biassed diode characteristics over a range.

Where devices have a plurality of active pins, they may be tested pin by pin or preferably a common connection is established between all active pin connections on the device and a single potential commonly applied, the measurement being made for consistency with a combined characteristic, for example the conduction of a plurality of parallel diodes. Alternatively active pin connections of all devices may be commonly tested to quickly establish the presence of any mis-orientated device on a board.

The applied potentials may be essentially d.c. but at least one is preferably pulsed, giving the advantages of speed and reduced power input.

It will be appreciated that a particular advantage of the present invention is that the applied voltages may be kept to a low value, below that at which any device damage can occur. The test may be performed with the board essentially unpowered and with no damage risk. Where diode tests are performed each applied voltage may be below even diode forward bias potential, which voltage individually is normally insufficient to inject any significant power into a device. To enable test the magnitude of applied voltages must in total be at least equal to diode forward bias potential.

Preferably the applied voltages are referenced to a ground potential, which is applied to a second device power input pin connection.

A particular advantageous aspect of the present invention is that when a test has shown that a mis-oriented device is connected at a first network, by the further step of analysing the results of tests at other networks to which a device connected to the first network is also connected, it may be established whether that device is the mis-oriented device.

In order that features and advantages of the present invention may be appreciated some examples will now be described by way of example only and with reference to the accompanying diagramatic drawings of which:

FIG. 5 is a flow diagram of ATE operation including an example of the present invention.

Figure 1:
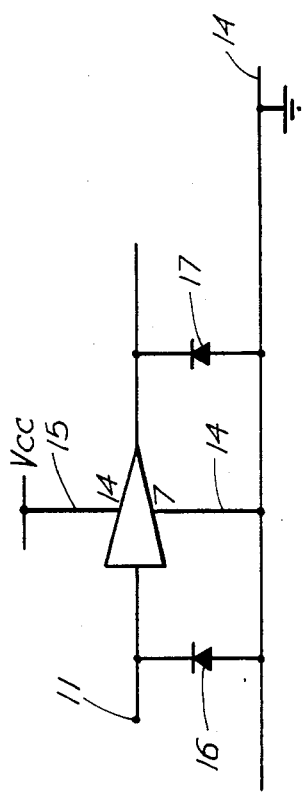
FIG. 1 represents one gate of a typical integrated circuit device.

A gate 10 (FIG. 1) of a typical integrated circuit has active connections constituting an input 11 and an output 12. The gate may be powered by ground connection 14 and power input connection 15, commonly referred to as $V_{cc}$. The device is packaged in a 14 pin dual-in-line package, and the pin connections for ground and $V_{cc}$ are 7 and 14 respectively, as is the common practice. A typical power supply potential would be between 5 and 15 V, with the input and output potential varying nominally between ground potential and $V_{cc}$. Internal diodes 16, 17 are formed with connection between active pins 11, 12 respectively and ground, but it will be noted that at all times the internal diodes 16, 17 are reverse biassed and hence conduct no significant current.

Figure 2:
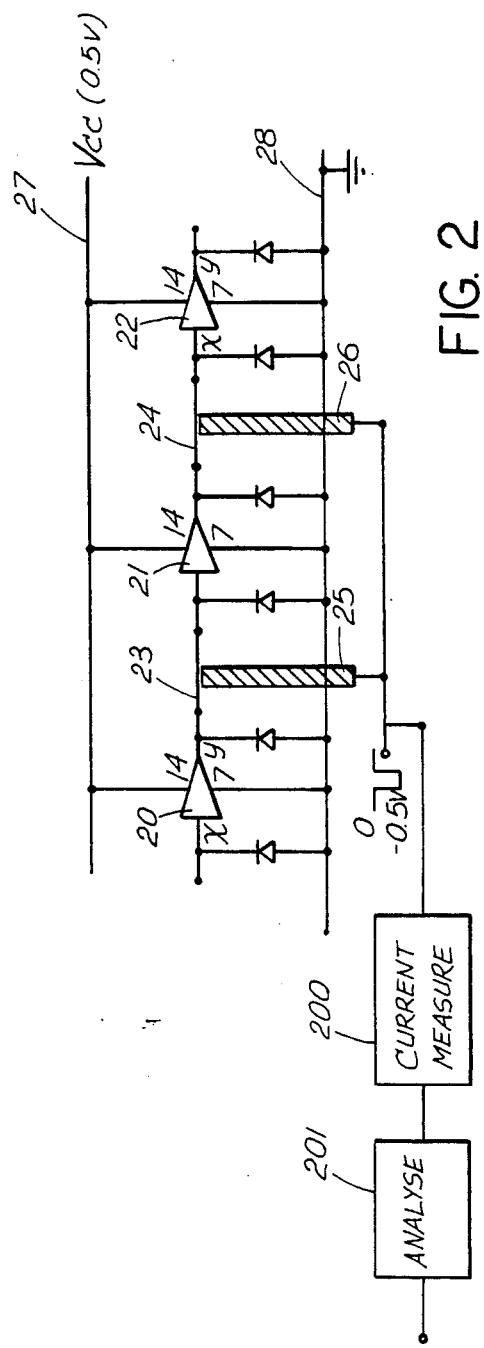
FIG. 2 represents part of a circuit, comprising gates from different devices.

In a circuit (FIG. 2) three gates 20, 21, 22 of the type described above are interconnected by virtue of networks 23 and 24. The gates are in different device packages and the interconnection provided by printed circuit board track and hence accessible by nails 25, 26 of an ATE shown in part, which equipment will also have connections to $V_{cc}$ rail 27 and ground rail 28. With ATE arranged in this manner, a device test on device 21 may be performed, as will now be described.

The ground rail 28 is connected to ATE ground potential and a low voltage (0.5 V) applied to the $V_{cc}$ rail. It will be noted this potential is not great enough to forward bias a semi-conductor diode for which typically 0.7 V (for silicon for example) would be required. Nails 25 and 26 connected to active device pins are made electrically common and a short duration (2 μS) negative going pulse of −0.5 V applied. It will be similarly noted that this magnitude of potential is also too small to bias a diode into conduction. During the time the negative potential is maintained the current flowing from $V_{cc}$ into the low potential is measured by measurement device 200. As is clear, the current will be zero or very small being due only to that across various semiconductor junctions, none of which are biased into conduction and is assessed as such by analysis device 201.

Applying such a low potential difference across the device supply pins ensures minimal power dissipation and eliminates the possiblity of damage to other connected devices.

Figure 3:
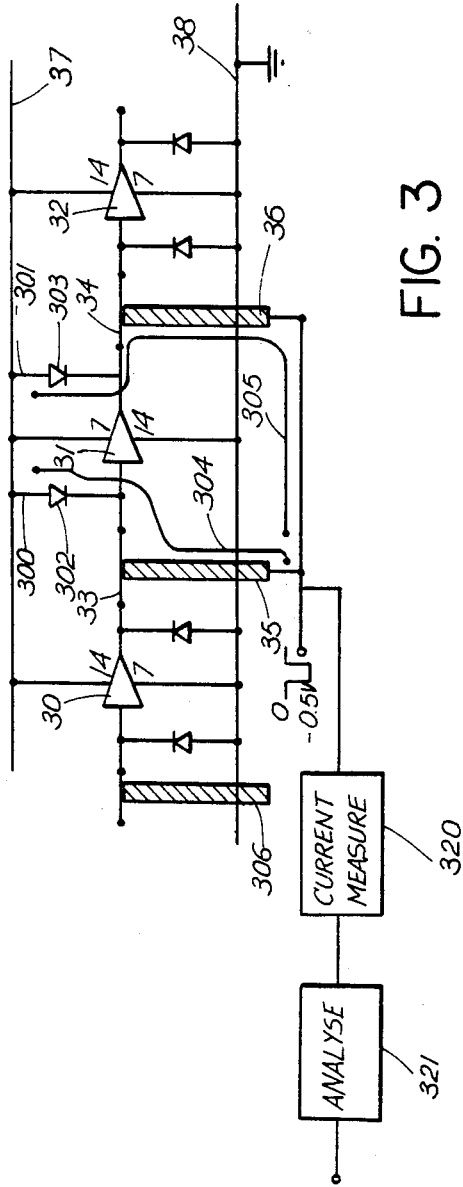
FIG. 3 represents the circuit of FIG. 2, one device being mis-orientated.

A similar test may be performed on device 31 (FIG. 3) of an identical circuit made up of gates 30, 31 and 32, in which the device of which gate 31 is part has been inserted in the wrong orientiation, so that ground pin 7 and $V_{cc}$ pin 14 have been cross connected to $V_{cc}$ rail 37 and ground rail 38 respectively. It will be noted that in addition the cross connection has caused diode anodes 300, 301 to be connected to the $V_{cc}$ rail. This time, with $V_{cc}$ potential applied as before, when the negative voltage is applied sufficient potential difference (1.0 v) appears across diodes 302, 303 and substantial current flow via paths 304, 305 and is measured by measurement device 320 occurs as is consistent with a forward biassed diode and is analyzed by analysis device 320. Thus the presence of a mis-orientated device at these networks is clearly demonstrated.

In a typical 14 pin device there will be 12 active pins, the networks associated with which are commoned for application of the negative pulse. Thus a current flow of 12 times that expected from a single foward biassed diode indicates incorrect orientation. Alternatively, nails connecting each network may be pulsed individually, when current due to a single such diode will flow if orientation is incorrect.

When device 30 comes to be tested by applying a negative going pulse to commoned nails 306 and 35 current will flow along path 304 via nail 35. However there will be no current via nail 306, and the failure current threshold will not be reached. Thus by analysing results obtained at other networks linked to a suspect device it is possible to determine which devices are mis-orientated.

It is assumed that the way in which voltages may be applied to networks and current measurements made as well as details of the device types to be expected at various locations on a printed circuit board stored in ATE are all familiar to the reader, as they are known in the art. Further decription of these points would unnecessarily detract from the clarity of the present description.

An important feature of the present invention is that at no time are devices fully powered, or subjected to damaging potential differences, even when a device is mis-orientated. For example, even in the case of device 31, where current may simultaneously flow through 12 paths via diodes the total power dissipation would be $12 \times 1 \times 10 = 120$ m W (assuming 10 mA for each forward biassed internal diode) and then only for 2 μS, which will not be damaging. In particular the reliability of other connected devices has not been called into question.

In the foregoing example a device where mis-orientation results in exchange of the power input and ground pin was considered, so that the common $V_{cc}$ and ground rails could be used as part of the test. The majority of logic devices are of this type and on many boards a complete test could be performed in this way. For devices for which this is not the case, such testing is inappropriate. Board locations of such devices may be stored in ATE and tested by individual power and ground pin connections at possible incorrect locations should the device be mis-orientated.

Figure 4:
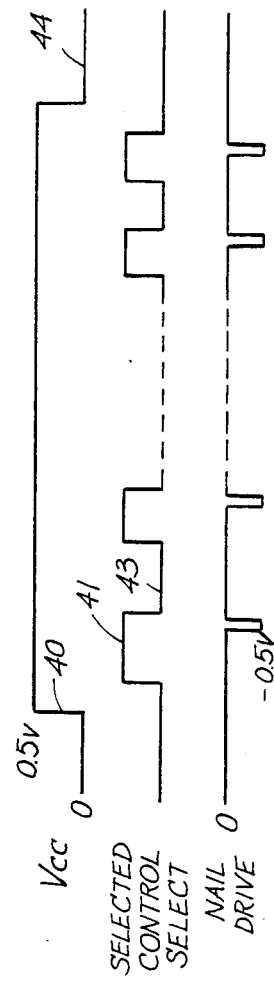
FIG. 4 is a timing diagram illustrative of the present invention.

In a timing diagram of the present invention (FIG. 4) a potential of 0.5 V (40) is first applied to the $V_{cc}$ rail or relevant connection. At the same time or previously, the ground rail is connected to ATE ground. A control signal (41) is generated to common selected nails prior to application of negative going pulse (42) during which time current flow is assessed. During the time control signal is low (43) the nails required to test the next device are selected. When all devices have been tested the $V_{cc}$ potential is removed (44).

It will be appreciated that a single current measurement and comparison with a previously determined threshold value constitutes a straightforward diode characteristic test. However, it will also be appreciated that with some devices or where other characteristics are for analysis, characteristic assessment may itself be based on a plurality of measurements, performed for example at different applied voltage to establish a dynamic device characteristic.

In order to reduce overall test duration, devices may be tested together. A searching algorithm may be employed to progressively eliminate good devices from suspicion, finally identifying bad devices.

The present invention may advantageously be included in a full ATE procedure, preferably after some preliminary checks such as shorts between networks or open circuits and before any test requiring the board to be powered such that there is no chance of device damage through mis-orientation of any device. A flow chart (FIG. 5) of the operation of such an ATE illustrates the present invention, by way of example.

A feature of the present invention is that the orientation of all devices may be tested in a single ATE visit, even in the presence of multiple mis-orientated devices.

I claim:

1. A method of testing integrated circuit device orientation in the presence of other interconnected devices, including the steps of:
   firstly locating a device power input pin connection position, locating a device active pin connection position, and locating a point of device interconnection;
   secondly, applying a voltage of magnitude less than device operating voltage between said device power input pin connection position and said point, and applying a voltage of opposite polarity between said device active pin connection position and said point;
   thirdly, measuring an inter pin electrical current characteristic of the device in the presence of the applied voltages;
   and fourthly performing a measurement analysis for a current characteristic consistent with a mis-orientated device.

2. A method of testing device orientation as claimed in claim 1 and wherein said applied opposite polarity voltage is in magnitude less than device supply voltage.

3. A method of testing device orientation as claimed in claim 1 and wherein an applied voltage is less than diode forward bias potential.

4. A method of testing device orientation as claimed in claim 1 and wherein measurement analysis is performed for a current characteristic consistent with a forward biassed diode.

5. A method of testing device orientation as claimed in claim 1 and wherein the point of device interconnection is a common ground.

6. A method of testing device orientation as claimed in claim 1 and wherein an inter pin electrical current characteristic is established by performing a plurality of measurements at different applied voltages.

7. A method of testing device orientation as claimed in claim 1 and including the step of measuring a plurality of inter pin electrical current characteristics simultaneously.

8. A method of testing device orientation as claimed in claim 1 and including the steps of establishing a common connection between a plurality of device active pins and performing measurement analysis for a current characteristic consistent with a plurality of forward biassed diodes.

9. A method of testing device orientation as claimed in claim 1 and wherein said applied voltage is a pulse.

10. A method of testing device orientation as claimed in claim 1 and wherein an electrical current characteristic is assessed with respect to previous measurements.

11. A method of testing device orientation as claimed in claim 1 and wherein an electrical current characteristic is assessed with respect to a threshold value.

12. A method of testing device orientation as claimed in claim 1 with automatic test equipment and wherein pin connection location includes the steps of accessing information stored in machine memory of said equipment.

13. A method of testing device orientation as claimed in claim 12 and including the step of predicting the locations of power and active pins of a mis-orientation device and testing orientation based on the prediction.

14. A method of testing device orientation as claimed in claim 1 and including the step of analysing orientation tests performed on a plurality of interconnected devices to identify a mis-orientated device.

15. A method of testing device orientation as claimed in claim 1 and applied to interconnected devices on a circuit board wherein voltage is applied to power input pin connections via board supply rails.

16. A method of testing device orientation as claimed in claim 10 and applied to interconnected devices on a circuit board wherein previous measurements relate to a board of the same type.

17. A method of testing device orientation as claimed in claim 1 and wherein said applied voltage of opposite polarity is a pulse.

* * * * *